(12) United States Patent
Yeom et al.

(10) Patent No.: US 6,891,211 B2
(45) Date of Patent: May 10, 2005

(54) FERROELECTRIC RANDOM ACCESS MEMORY DEVICE AND METHOD FOR FABRICATING THE SAME

(75) Inventors: Seung-Jin Yeom, Ichon-shi (KR); Eun-Seok Choi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 32 days.

(21) Appl. No.: 10/612,914

(22) Filed: Jul. 7, 2003

(65) Prior Publication Data

US 2004/0013014 A1 Jan. 22, 2004

(30) Foreign Application Priority Data

Jul. 19, 2002 (KR) .................. 10-2002-0042627

(51) Int. Cl.[7] ........................... H01L 31/062
(52) U.S. Cl. ................. 257/295; 257/E27.104
(58) Field of Search ................. 257/295, E27.104

(56) References Cited

U.S. PATENT DOCUMENTS 6,440,754 B2  8/2002  Hayashi et al.
6,479,849 B1 * 11/2002  Katori ................... 257/296
6,541,375 B1  4/2003  Hayashi et al.

FOREIGN PATENT DOCUMENTS

| KR | 1998-63820 | 10/1998 | .......... H01L/29/40 |
| KR | 2001-56098 | 7/2001 | .......... H01L/21/24 |

* cited by examiner

Primary Examiner—David Nelms
Assistant Examiner—Tu-Tu Ho
(74) Attorney, Agent, or Firm—Jacobson Holman PLLC

(57) ABSTRACT

The present invention is related to a ferroelectric memory device and a method for fabricating the same. The ferroelectric memory device includes: a substrate providing a transistor; a first insulation material with a plane surface formed on the substrate; a storage node contact passing through the first insulation material to contact to an active region of the substrate; a lower electrode being connected to the storage node contact and including a solid solution layer disposed at least as an upper most layer, the solid solution layer being doped with a metal element, which is induced to be in a solid solution state; a second insulation material having a plane surface that exposes a surface of the lower electrode, encompassing the lower electrode and being formed on the first insulation material; a ferroelectric layer covering the second insulation material including the lower electrode; an upper electrode formed on the ferroelectric layer.

10 Claims, 5 Drawing Sheets

FERROELECTRIC RANDOM ACCESS MEMORY DEVICE AND METHOD FOR FABRICATING THE SAME

FIELD OF THE INVENTION

The present invention relates to a semiconductor device; and, more particularly, to a ferroelectric random access memory device and a method for fabricating the same.

DESCRIPTION OF RELATED ARTS

Generally, there has been progressively developed a device capable of overcoming a refresh limit required for a dynamic random access memory (DRAM) device and yet obtaining a large memory capacitance by using a ferroelectric thin film for a ferroelectric capacitor. A ferroelectric random access memory (FeRAM) device using such ferroelectric thin film is one type of nonvolatile memory devices. Particularly, the FeRAM device is highlighted as a next generation memory device owing to its advantages that the FeRAM device is able to save information even if power is off and has an operation speed equivalent to the DRAM device.

FIG. 1 is a cross-sectional view showing a conventional FeRAM device.

As shown, a device isolation layer 12 defining an active region is formed on a substrate 11, and a stack structure of a gate oxide layer 13 and a word line 14 is formed thereon. Source/drain regions 15A and 15B are formed at both lateral sides of the word line 14.

A first inter-layer insulation layer 16 is formed on a transistor including the word line 14 and the source/drain regions 15A and 15B. Afterwards, a bit line 18 passes through the first inter-layer insulation layer 16 and is connected to one source/drain region 15A through a bit line contact 17 contacting to the source/drain region 15A.

A second inter-layer insulation layer 19 is formed on an entire surface including the bit line 18, and a storage node contact 20 is then formed by passing simultaneously through the first and the second inter-layer insulation layers 16 and 19 and contacting to the other source/drain region 15B.

Also, a lower electrode 21 is connected to the storage node contact 20. Also, a planarized isolating insulation layer 22 for isolating the neighboring lower electrodes 21 encompasses the lower electrode 21. A ferroelectric layer 23 covers the isolating insulation layer 22 and the lower electrode 21. Herein, the ferroelectric layer 23 is formed only on a cell region. At this time, the lower electrode 21 is a stack layer of an Ir layer 21A, an $IrO_2$ layer 21B and a Pt layer 21C.

Lastly, an upper electrode 24 is formed on the ferroelectric layer 23.

In the above, the lower electrode 21 is precedently formed to allow the isolating insulation layer 22 to encompass the lower electrode 21. Subsequently, the isolating insulation layer 22 is subjected to a chemical mechanical polishing (CMP) process until exposing a surface of the lower electrode 21 so as to make the isolating insulation layer 22 planarized.

Also, the ferroelectric layer 23 and the upper electrode 24 are formed on an entire surface of the cell region after forming the lower electrode 21 encompassed by the isolating insulation layer 22. Then, a thermal process is performed to crystallize the ferroelectric layer 23 and pattern only the upper electrode 24.

However, there occurs a scratch phenomenon in which an interface between the $IrO_2$ layer 21B and the Ir layer 21A is exposed due to disappearance of a grain boundary caused by softening of the pt layer 21C during the CMP process for forming the isolating insulation layer 22. Also, the exposed $IrO_2$/Ir electrode reacts with oxygen added during the thermal process for nucleation and crystallization of the ferroelectric layer 23, resulting in electric degradation of the capacitor and frequent soft errors.

SUMMARY OF THE INVENTION

It is, therefore, an object of the present invention to provide a ferroelectric memory device capable of preventing a scratch phenomenon of a metal layer constituting a lower electrode when performing a chemical mechanical polishing (CMP) process for burying an upper electrode into an isolating insulation layer and a method for fabricating the same.

In accordance with an aspect of the present invention, there is provided a ferroelectric memory device, including: a substrate providing a transistor; a first insulation material with a plane surface formed on the semiconductor substrate; a storage node contact passing through the first insulation material to contact to an active region of the substrate; a lower electrode being connected to the storage node contact and including a solid solution layer disposed at least as an upper most layer, the solid solution layer being doped with a metal element, which is induced to be in a solid solution state; a second insulation material having a plane surface that exposes a surface of the lower electrode, encompassing the lower electrode and being formed on the first insulation material; a ferroelectric layer covering the second insulation material including the lower electrode; and an upper electrode formed on the ferroelectric layer.

In accordance with another aspect of the present invention, there is also provided a method for fabricating a ferroelectric memory device, including the steps of: forming an inter-layer insulation layer on a substrate providing a transistor; forming a storage node contact passing through the inter-layer insulation layer and then contacting to a source/drain region of the transistor; forming a lower electrode being connected to the storage node contact and including a solid solution layer disposed at least as an upper most layer where a metal element is doped and subsequently induced to be in a solid solution state; forming an isolating insulation layer exposing a surface of the lower electrode and encompassing the lower electrode; forming a ferroelectric layer on an entire surface including the isolating insulation layer; and forming an upper electrode on the ferroelectric layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1:
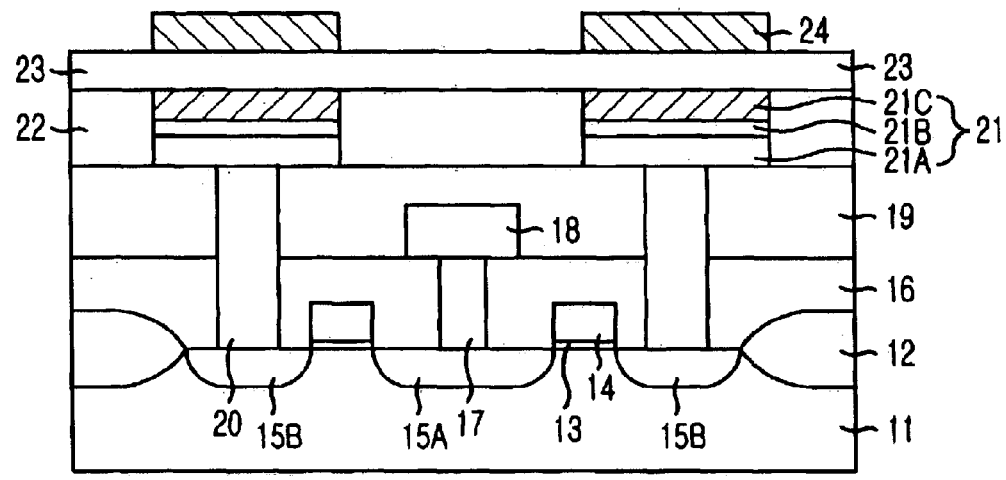
FIG. 1 is a cross-sectional view illustrating a conventional ferroelectric memory device.
Figure 2A:
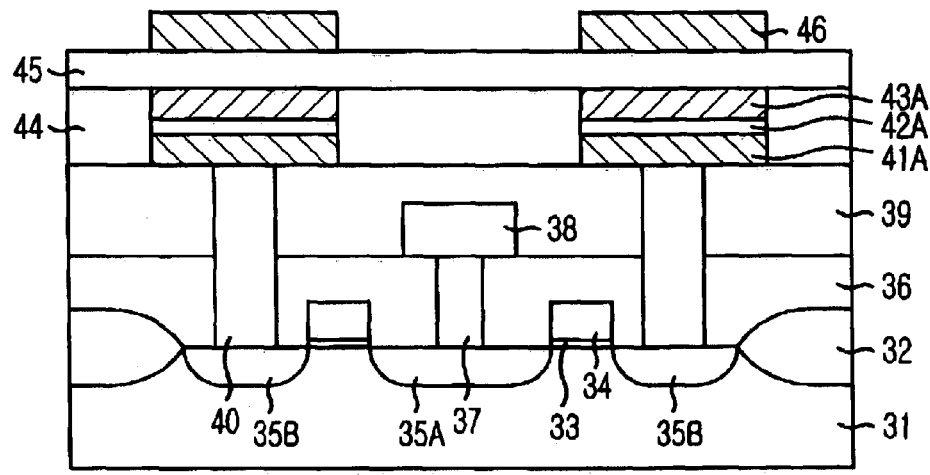
FIG. 2A is a cross-sectional view showing a ferroelectric memory device in accordance with a preferred embodiment of the present invention.

FIG. 2A is a cross-sectional view showing a ferroelectric memory device in accordance with a preferred embodiment of the present invention.

As shown, the ferroelectric memory device includes: a substrate 31 providing a transistor having source/drain regions 35A and 35B and a word line 33; a first insulation material used for a first inter-layer insulation layer 36 having a plane surface and being formed on the substrate 31 and a second inter-layer insulation layer 39 formed on the first inter-layer insulation layer 36; a bit line 38 connected to one source/drain region 35A through a bit line contact 37; a storage node contact 40 connected to the other source/drain region 35B by passing through the first insulation material; a lower electrode being connected to the storage node contact 40 and having a solid solution layer 43A disposed at least as an upper most layer; an isolating insulation layer 44 encompassing the lower electrode and having a plane surface exposing a surface of the lower electrode; a ferroelectric layer 45 covering the isolating insulation layer 44 including the lower electrode; and an upper electrode 46 formed on the ferroelectric layer 45. Herein, the solid solution layer is doped with a metal (hereinafter referred as to M) element that is subsequently induced to be a solid solution and subsequently reinforced.

The lower electrode has a stack structure sequentially deposited with an Ir layer 41A, an $IrO_2$ layer 42A and a Pt—M solid solution layer 43A. The Pt—M solid solution layer 43A is formed through a sputtering technique by doping the M element into grains and grain boundaries of Pt, and thus, inducing a predetermined amount of the M element to be in a solid solution state at a Pt target.

Such metal M can be any one selected from a group consisting of Ru, Ir, Rh, Pd, Os and Ag or any two elements of the above.

Eventually, the Pt—M solid solution layer 43A is a layer containing such metal. That is, it can be any one selected from a group consisting of a Pt—Ru solid solution layer, a Pt—Ir solid solution layer, a Pt—Rh solid solution layer, a Pt—Pd solid solution layer, a Pt—Os solid solution layer, a Pt—Ag solid solution layer or a Pt—Au solid solution layer or any one selected among tertiary solid solution layers including two elements selected from a group consisting of Ru, Ir, Rh, Pd, Os, Ag and Au. A Pt—Ru—Rh solid solution layer is an example of the tertiary solid solution layer.

In addition, the Pt—M solid solution layer 43A has a thickness in a range from about 100 Å to about 4000 Å.

Figure 2B:
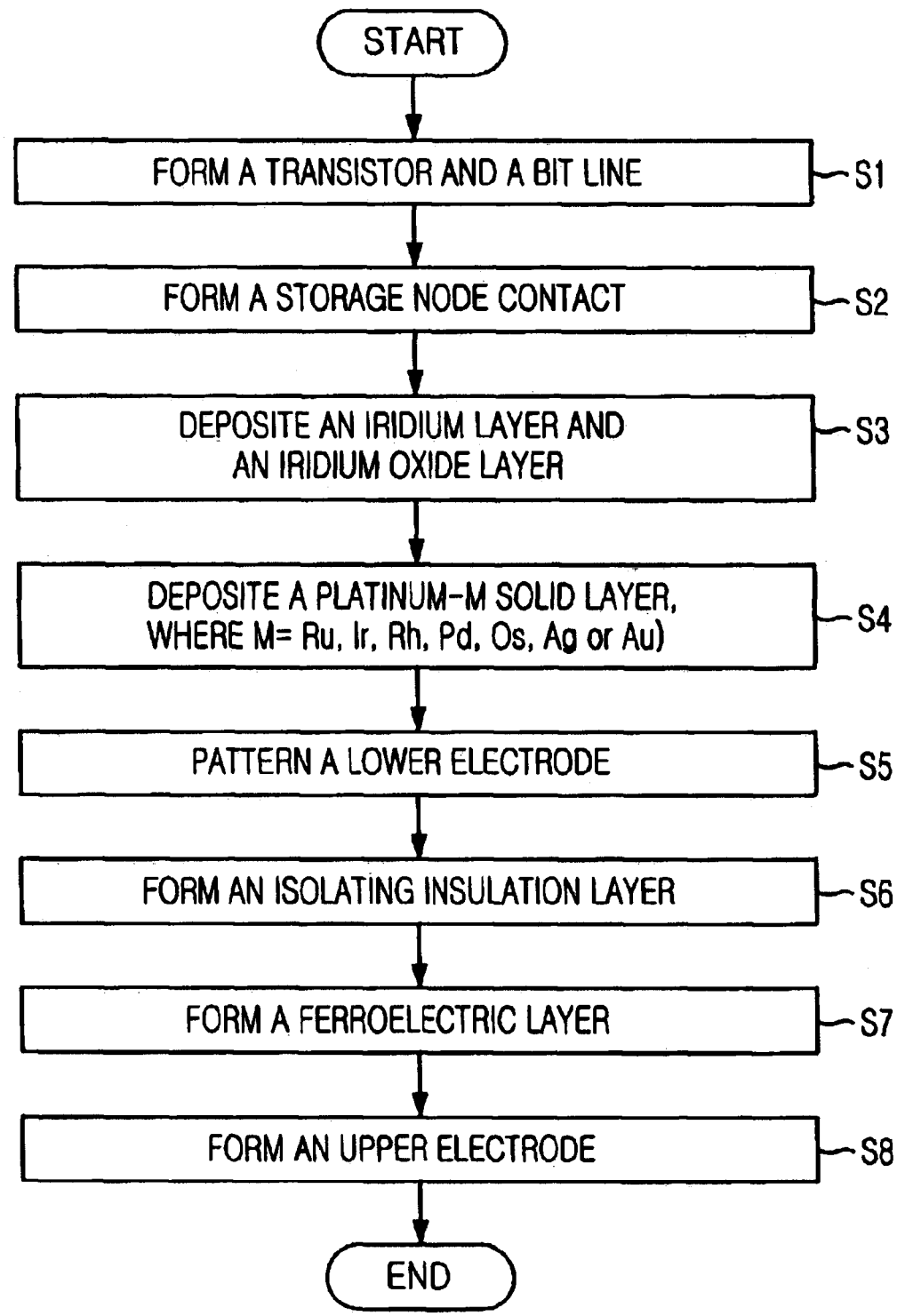
FIG. 2B is a flowchart showing fabrication procedures for the ferroelectric memory device shown in FIG. 2A.

FIG. 2B is a flowchart showing fabrication procedures for the ferroelectric memory device described in FIG. 2A. There is a series of fabrication procedures including a transistor and a bit line formation step S1, a storage node contact formation step S2, an Ir and $IrO_2$ layer deposition step S3, a Pt—M solid solution layer deposition step S4, a lower electrode patterning step S5, an isolating isolation layer formation step S6, a ferroelectric layer formation step S7 and an upper electrode formation process S8.

FIGS. 3A to 3E are cross-sectional views showing a method for fabricating a ferroelectric memory device in accordance with the fabrication procedures described in FIG. 2B.

Figure 3A:
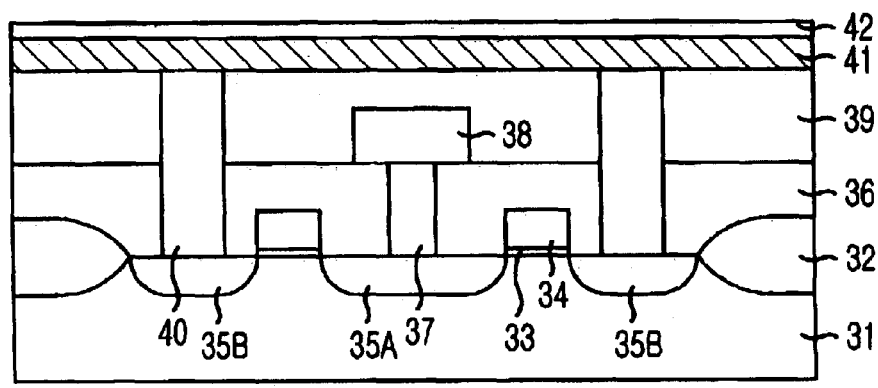
FIGS. 3A to 3E are cross-sectional views showing a method for fabricating the ferroelectric memory device shown in FIG. 2A.

Referring to FIG. 3A, a device isolation layer 32 for isolating devices is formed on a substrate 31 so to define an active region, and a gate oxide layer 33 and a word line 34 are sequentially formed on the active region of the substrate 31.

Next, source/drain regions 35A and 35B are formed at lateral sides of the word line 34 by ion-implanting an impurity to the substrate 31.

Meanwhile, although it is not illustrated in the drawings, a spacer can be formed at the lateral sides of the word line 34 to thereby form a source/drain region with a lightly doped drain (LDD) structure. That is, a lowly concentrated impurity is ion-implanted by using the word line 34 as a mask so as to form a LDD region, and a spacer is formed at the lateral sides of the word line 34 thereafter. The word line 34 and the spacer are then used as a mask while ion-implanting a highly concentrated impurity so that a source/drain region contacting to the LDD region is formed.

Next, a first inter-layer insulation layer 36 is deposited on the substrate 31 providing a transistor and planarized thereafter. Then, the first inter-layer insulation layer 36 is etched with use of a contact mask (not shown) so as to form a bit line contact hole exposing one source/drain region 35A, and subsequently form a bit line contact 37 buried into the bit line contact hole. Herein, the bit line contact 37 can be formed through an etch-back process or a chemical mechanical polishing (CMP) process after depositing tungsten (W).

A conductive layer for a bit line 38 is deposited and patterned so to form the bit line 38 connected to the bit line contact 37. After forming the bit line 38, a second inter-layer insulation layer 39 is deposited on the above entire structure including the bit line 38 and planarized thereafter.

Continuous to the second inter-layer insulation layer 39 formation, the second inter-layer insulation layer 39 and the first inter-layer insulation layer 36 are simultaneously etched to form a storage node contact hole exposing the other source/drain region 35B. Afterwards, the storage node contact 40 is buried into the storage node contact hole.

Meanwhile, the storage node contact 40 has a stack structure deposited sequentially with a polysilicon plug, a titanium silicide layer and a titanium nitride layer. A method for forming this stack structure will be omitted. Herein, the titanium silicide layer forms an ohmic contact between the polysilicon plug and a lower electrode. Also, the titanium nitride layer acts as a diffusion barrier layer for preventing reciprocal diffusions between the polysilicon plug and the lower electrode.

For another type of the storage node contact 40, a thermal process is performed after depositing a titanium layer so that a titanium silicide layer is formed. Then, a tungsten layer is plugged and a titanium nitride layer is formed as a barrier metal.

Next, an Ir layer 41 and an $IrO_2$ layer 42 are sequentially deposited on the second inter-layer insulation layer 39 including the storage node contact 40. At this time, the Ir layer 41 is an oxygen barrier layer.

Figure 3B:
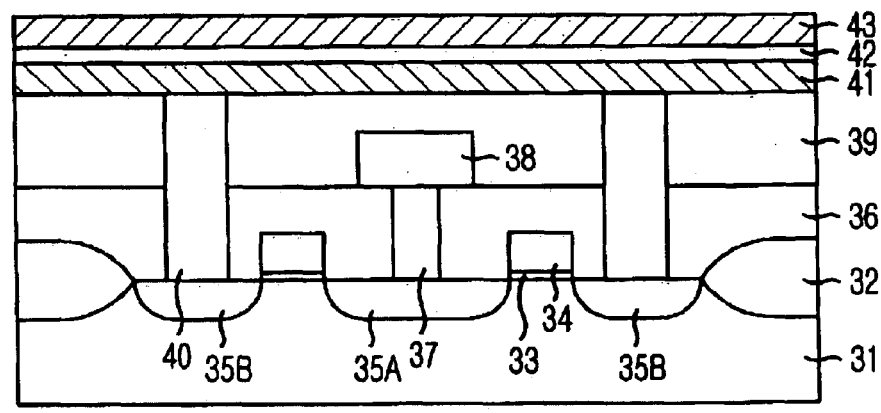

With reference to FIG. 3B, a Pt—M solid solution layer 43 is formed on the $IrO_2$ layer 42. At this time, the deposition of the Pt—M solid solution layer 43 can be proceeded with two separate steps of forming a Pt—M solid solution target by inducing a metal M element with predetermined amounts to be a solid solution at a Pt target and of depositing the Pt—M solid solution layer 43 by using a sputtering technique.

That is, the Pt—M solid solution target is a Pt—M solid solution layer obtained by doping an M element into grains and grain boundaries of Pt. Such M element can be any one selected from a group consisting of Ru, Ir, Rh, Pd, Os, Ag and Au or any two elements selected from the above.

Eventually, the Pt—M solid solution layer 43 is a layer containing the M element, and thus, can be any one selected from a group consisting of a Pt—Ru solid solution layer, a Pt—Ir solid solution layer, a Pt—Rh solid solution layer, a Pt—Pd solid solution layer, a Pt—Os solid solution layer, a Pt—Ag solid solution layer or a Pt—Au solid solution layer or any one selected among tertiary solid solution layers including any two elements selected from a group consisting of Rh, Ir, Rh, Pd, Os, Ag and Au. A Pt—Ru—Rh solid solution layer is an example of the tertiary solid solution layer.

In the mean time, when forming the Pt—M solid solution target, a quantity of the doped M element ranges from about 1% to about 15%. Although the doping level of the M element varies according to a solid solution level of the M element, the doing level of the M element is set to be less than the solid solution level in order to prevent the formation of different phases in the Pt—M solid solution layer 43.

Also, the Pt—M solid solution layer 43 is deposited to a thickness ranging from about 100 Å to about 4000 Å. The sputtering technique is performed at a temperature ranging from about 25° C. to about 600° C. and at a pressure of about 0.5 mtorr to about 20 torr. Powers ranging from about 500 W to about 3 kW are supplied to generate plasma.

The Pt—M solid solution layer 43 deposition with use of the sputtering technique that employs the Pt solid solution target is proceeded with a series of steps as the following: in a vacuum state, Ar gas is supplied to a space between the Pt—M solid solution target in a reactive deposition chamber and the substrate 31 where the $IrO_2$ layer 42 is deposited; the Ar gas is then ionized to form Ar plasma; $Ar^+$ ions of the Ar plasma get accelerated and collided onto a surface of the Pt—M solid solution target through the use of electric field; atoms or molecules come out of the surface of the Pt—M solid solution target due to kinetic energy conversion caused by the collision; and the those atoms or molecules $Pt^+$ or $M^+$ are chemically react with each other and deposited on the $IrO_2$ layer 42, completing the Pt—M solid solution layer 43 formation.

Figure 3C:
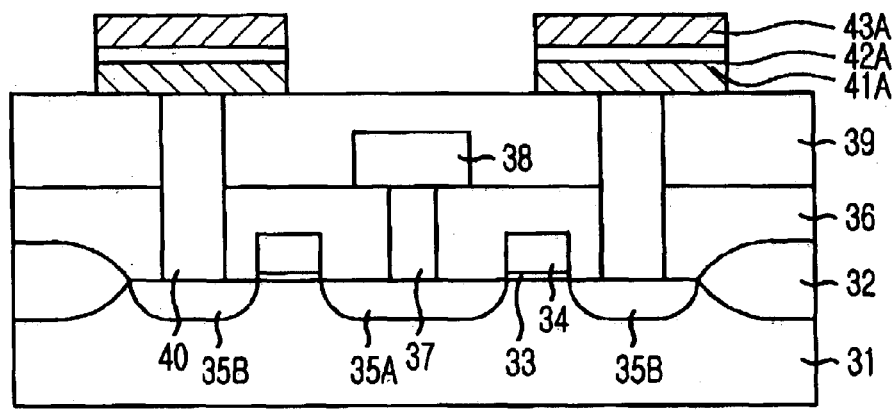

Referring to FIG. 3C, a mask (not shown) defining a lower electrode is formed on the Pt—M solid solution layer 43. Then, this mask is used as an etch mask to pattern simultaneously the Pt—M solid solution layer 43, the $IrO_2$ layer 42 and the Ir layer 41 so that a stack structure of the lower electrode is formed. Herein, the patterned Pt—M solid solution layer 43, the $IrO_2$ layer 42 and the Ir layer 41 are referred as 43A, 42A and 41A, respectively, and these patterned layers are constitution elements of the stack structure of the lower electrode.

Figure 3D:
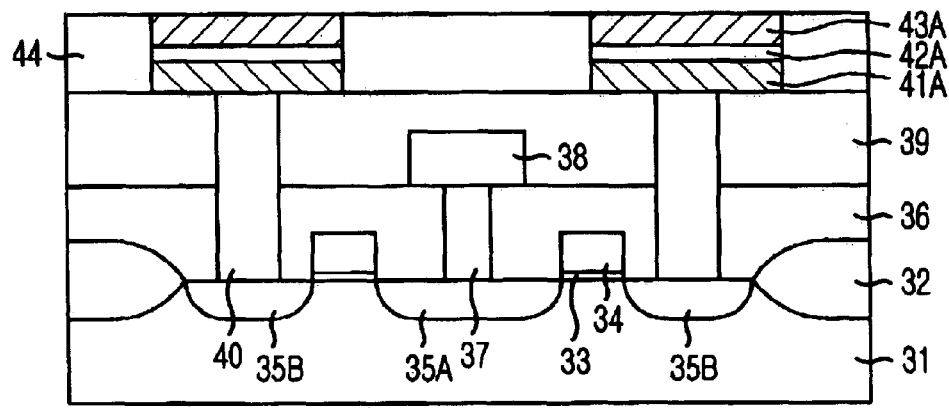

Referring to FIG. 3D, an isolating insulation layer 44 is formed on an entire surface of the lower electrode. At this time, the isolating insulation layer 44 is a silicon oxide layer containing impurities and can be any one selected from a group consisting of a high density plasma (HDP) oxide layer, boro-phospho-silicate glass (BPSG), boron silicate glass (BSG) and phosphorous silicate glass (PSG). Herein, the reasons for using the silicon oxide layer including impurities as the isolating insulation layer 44 are because a silicon oxide without impurities induces a short circuit of a ferroelectric circuit as strong compressive stress is exerted to the lower electrode and makes it difficult to perform a planarization process due to its coverage along the lower electrode.

Next, a chemical mechanical polishing (CMP) process is performed until exposing a surface of the Pt—M solid solution layer 43A so that the lower electrode is formed in such a manner of being isolated from an adjacent lower electrode. At this time, the isolating insulation layer 44 remained after the CMP process encompasses the lower electrode.

Since the isolating insulation layer 44 is formed in such a manner to encompass the lower electrode, it is possible to overcome burdens of the mask process caused by a step difference in a capacitor and difficulties of the planarization and to prevent a short circuit between the lower electrode and upper electrode.

For another method for isolating the lower electrodes from each other, a hard mask is used to deposit a titanium nitride layer at a temperature of about 200° C. to about 600° C. until having a thickness ranging from about 100 Å to about 2000 Å. This titanium nitride layer is used as a stop layer during a CMP process.

As described above, the Pt—M solid solution layer 43A is doped with the M element, which is, in turn, induced to be in a solid solution state. As a result of this solid solution state, the Pt—M solid solution layer 43A has a strong adhesion property with respect to a mechanical stress. This characteristic further prevents a scratch phenomenon occurring during the CMP process.

Also, the Pt—M solid solution layer 43A prevents diffusions of oxygen added during a nucleation and a thermal process for crystallization of a subsequent ferroelectric layer 45 so as to stabilize the capacitor electrically.

Figure 3E:
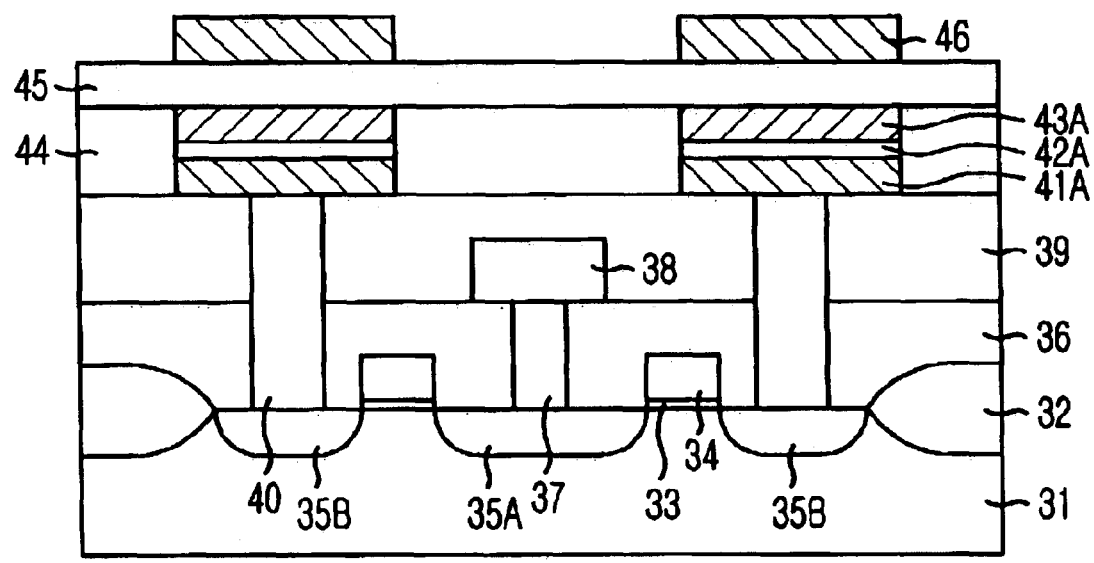

Referring to FIG. 3E, the ferroelectric layer 45 is formed on the above planarized structure until having a thickness ranging between about 50 Å to about 3000 Å, and an upper electrode 46 is formed thereon. Herein, the ferroelectric layer 45 has a sequence of a nucleation, a nucleus growth and a grain growth. For the nucleation, a rapid thermal annealing (RTA) technique is used, and a ramp-up rate of the RTA technique ranges from about 80° C. to about 250° C. Also, the grain growth is proceeded by performing a furnace annealing technique at a temperature in a range from about 500° C. to about 800° C.

In the mean time, the ferroelectric layer 45 can be any one selected from a group consisting of $SrBi_2Ta_2O_9$ (SBT), $SrBi_2(Ta_{1-x}, Nb_x)_2O_9$ (SBTN), $Bi_4Ti_3O_{12}$ (BTO), $(Bi_{1-x}, La_x)Ti_3O_{12}$ (BLT), (Pb, Zr) $TiO_3$ (PZT) or a combination of the above. The upper electrode 46 is deposited through the use of any one technique selected among a chemical vapor deposition (CVD), a physical vapor deposition (PVD), an atomic layer deposition (ALD) and a plasma enhanced atomic layer deposition (PEALD) techniques. Also, the upper electrode 46 uses any one material selected from a group consisting of Pt, Ir, Ru, Re and Rh or any complex material of the above.

In the ferroelectric memory device shown in FIG. 2, the lower electrode has the stack structure deposited with the Ir layer 41A, the $IrO_2$ layer 42A and the Pt—M solid solution layer 43A. However, in a ferroelectric memory device having a lower electrode encompassed by an isolating insulation layer, it is still possible to use only the Pt—M solid solution layer 43A as the lower electrode.

By using the solid solution layer 43A as a metal layer of the lower electrode, it is possible to secure electric property of the capacitor by preventing occurrences of the scratch phenomenon of the metal layer when performing the CMP process for burying the lower electrode into the isolating insulation layer.

While the present invention has been described with respect to certain preferred embodiments, it will be apparent to those skilled in the art that various changes and modifications may be made without departing from the scope of the invention as defined in the following claims.

What is claimed is:

1. A ferroelectric memory device, comprising:
   a substrate providing a transistor;
   a first insulation material with a plane surface formed on the substrate;

a storage node contact passing through the first insulation material to contact to an active region of the substrate;

a lower electrode being connected to the storage node contact and including a solid solution layer disposed at least as an upper most layer, the solid solution layer being doped with a metal element, which is induced to be in a solid solution state;

a second insulation material having a plane surface that exposes a surface of the lower electrode, encompassing the lower electrode and being formed on the first insulation material;

a ferroelectric layer covering the second insulation material including the lower electrode; and an upper electrode formed on the ferroelectric layer.

2. The ferroelectric memory device as recited in claim 1, wherein the solid solution layer is a Pt-metal solid solution layer where a metal element is doped into a Pt layer and induced to be in a solid solution state thereafter.

3. The ferroelectric memory device as recited in claim 1, wherein the metal can be any one selected from a group consisting of Ru, Ir, Rh, Pd, Os, Ag and Au, or any two elements of the above.

4. The ferroelectric memory device as recited in claim 1, wherein the lower electrode has a stack structure sequentially deposited with an Ir layer, an $IrO_2$ layer and the solid solution layer.

5. The ferroelectric memory device as recited in claim 1, wherein the solid solution layer has a thickness ranging from about 100 Å to about 4000 Å.

6. A method for fabricating a ferroelectric memory device, comprising the steps of:

forming an inter-layer insulation layer on a substrate providing a transistor;

forming a storage node contact passing through the inter-layer insulation layer and then contacting to a source/drain region of the transistor;

forming a lower electrode being connected to the storage node contact and including a solid solution layer disposed at least as an upper most layer where a metal element is doped and subsequently induced to be in a solid solution state;

forming an isolating insulation layer exposing a surface of the lower electrode and encompassing the lower electrode;

forming a ferroelectric layer on an entire surface including the isolating insulation layer; and forming an upper electrode on the ferroelectric layer.

7. The method as recited in claim 6, wherein the solid solution layer is a Pt-metal solid solution layer formed by doping a metal element into a Pt layer and subsequently obtaining a solid solution state at the step of forming the lower electrode.

8. The method as recited in claim 7, wherein the metal element can be any one selected from a group consisting of Ru, Ir, Rh, Pd, Os, Ag and Au or any two elements of the above.

9. The method as recited in claim 7, wherein the step of forming the Pt-metal solid solution layer further includes the steps of:

forming a Pt-metal solid solution layer target by inducing a metal element with a predetermined amount to be in a solid solution state at a Pt target; and depositing the Pt-metal solid solution layer through a sputtering technique applied to the Pt—metal solid solution target.

10. The method as recited in claim 9, wherein the step of depositing the Pt-metal solid solution layer is proceeded at a temperature of about 25° C. to about 600° C. and at a pressure of about 0.5 mtorr to 20 torr in a state of supplying a power of about 500 W to about 3 kW for generating plasma.

* * * * *